(12) United States Patent
Choi (10) Patent No.: US 6,436,755 B1
(45) Date of Patent: Aug. 20, 2002

(54) DYNAMIC RANDOM ACCESS MEMORY CELL AND METHOD FOR FABRICATING THE SAME

(75) Inventor: Jin Hyeok Choi, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/612,850

(22) Filed: Jul. 10, 2000

Related U.S. Application Data (62) Division of application No. 09/222,203, filed on Dec. 29, 1998, now Pat. No. 6,088,260.

(30) Foreign Application Priority Data

Dec. 30, 1997 (KR) .............................................. 97-77900

(51) Int. Cl.[7] .............................................. H01L 82/42
(52) U.S. Cl. ........................ 438/239; 438/253; 438/396
(58) Field of Search ................................... 438/149, 151, 438/173, 174, 194, 217, 228–256, 381–399

(56) References Cited

U.S. PATENT DOCUMENTS 5,767,562 A * 6/1998 Yamashita ................... 257/500
5,805,497 A * 9/1998 Uchida ........................ 365/156

* cited by examiner

*Primary Examiner*—Matthew Smith
*Assistant Examiner*—Calvin Lee
(74) *Attorney, Agent, or Firm*—Ladas & Parry

(57) ABSTRACT

A dynamic random access memory(DRAM) cell having no capacitor, comprising: a silicon layer doped with impurities of a first conductivity type; a metal oxide semiconductor (MOS) transistor having a gate formed on one surface of the silicon layer and a source and drain regions formed in the silicon layer, the source and the drain regions being doped with impurities of a second conductivity type to induce channel the silicon layer under the gate; an insulating layer formed on another surface of the silicon layer; a conduction layer for a plate electrode formed on the insulating layer; and a purge region formed in the silicon layer to purge minor carriers induced in an interface surface between the silicon layer and the insulating layer, the purge region doped with impurities of the first conductivity type.

4 Claims, 7 Drawing Sheets

DYNAMIC RANDOM ACCESS MEMORY CELL AND METHOD FOR FABRICATING THE SAME

This application is a division of U.S. Ser. No. 09/222,203 filed on Dec. 29, 1998 and issued as U.S. Pat. No. 6,088,260, which is assigned to the assignee of the present application.

BACKGROUND OF THE INVENTION

This invention relates to a dynamic random access memory(DRAM) cell, and more particularly to a DRAM cell having no a capacitor using a silicon-on-insulator (SOI) substrate.

Figure 1A:
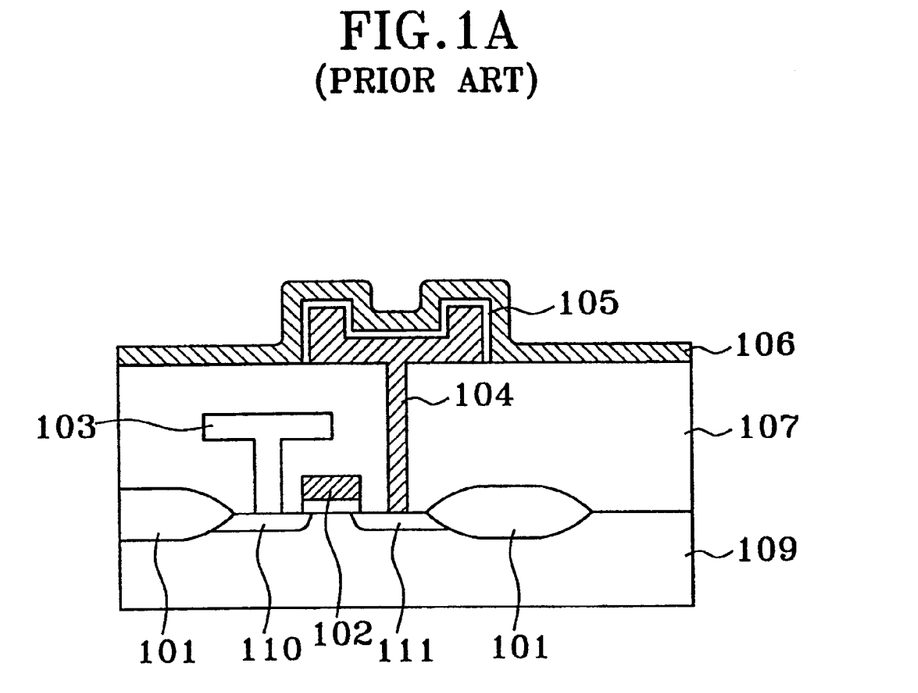
FIG. 1a is a sectional view of a conventional DRAM cell.
Figure 1B:
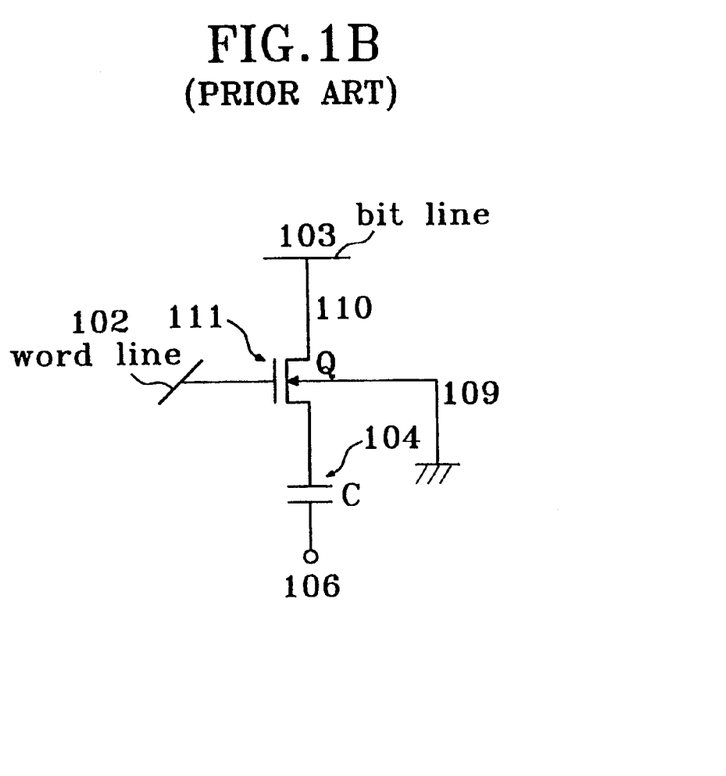

FIG. 1a shows a sectional view of a conventional DRAM cell and FIG. 1b shows an equivalent circuit of the DRAM cell in FIG. 1a. The reference numeral 101 denotes an isolation film, 102 a gate electrode(word line) of a transistor Q, 103 a bit line, 104 a storage electrode of a capacitor C, 105 a dielectric of the capacitor C, 106 a plate electrode of the capacitor C, 107 an intermediate insulating layer, 109 a silicon substrate, and 110 and 111 a source and a drain regions of the transistor Q. As shown in FIG. 1a and FIG. 1b, an electrically readable and programmable DRAM cell includes one transistor Q and one capacitor C. In program, the signal "0" or "1" is programmed in the capacitor C according to the charge of electrons. In read, the signal "0" or "1" programmed in the capacitor C is read through the transistor Q.

In order to increase the integrity of DRAM, it should reduce the transistor Q as well as the capacitor C in size. The capacitance of the capacitor C depends on the size of the capacitor. The capacitance of the capacitor C is decreased with reduction of the size and therefore it can not reduce in size infinitely. In order to assuredly program the signal "0" or "1" in the capacitor C and to accurately read the signal "0" or "1" programmed in the capacitor C, the capacitor C should have the capacitance of above 20 fF(femto-farad). The reason is that it is for charges accumulated in the capacitor C to directly use in driving a sense amplifier.

In more detail, in program, the signal "1" or "0" is programmed in the capacitor C by turning on the transistor Q. In read, the charges charged in the capacitor C is discharged through the transistor by turning on the transistor Q and the discharged charges are transferred to an external sense amplifier(not shown in drawings) connected to the bit line 103 through the bit line 103. At this time, the voltage variation of the sense amplifier is produced according to an amount of the transferred charges to read the signal programmed in the capacitor C.

Because a parasitic capacitor is made in the bit line, while charges discharged from the capacitor are transferred to the sense amplifier, a portion of the charges becomes extinct. In consideration of extinction of charges through the parasitic capacitor in the bit line, the capacitor having a capacitance of beyond a selected capacity, for example above 20 fF should be required in the DRAM cell. Furthermore, in case the capacitor has a relatively low capacitance, it takes a lot of time to reach charges from the capacitor to a sense amplifier, resulting in a lowering of operation speed of the DRAM cell. So as to solve the problem, the capacitor having a capacitance of beyond a selected capacity, for example above 20 fF should be required. Therefore, so as to increase the integrity of DRAM, it is very essential to reduce the size of the capacitor with maintenance of the desired capacitance. Recently, the study on the capacitor with small size and a large capacitance is in progress. For an example, the formation technology of a 3-dimensional capacitor is proposed to enlarge an effective area of a capacitor in a relatively small chip size. However, the process for fabricating the 3-dimensional capacitor is very complicate and difficult, thereby resulting in increase in fabrication cost of DRAM cells and decrease in fabrication yield.

SUMMARY OF THE INVENTION

There is an object of the present invention to provide a DRAM cell having no capacitance using a SOI substrate and a method for fabricating the same.

According to an aspect of the present invention, there is provided to a DRAM cell, comprising: a silicon layer doped with impurities of a first conductivity type; a MOS transistor having a gate formed on one surface of a semiconductor layer and a source and drain regions formed in the semiconductor layer under the gate, the source and drain regions being doped with a first conductivity impurity to induce a channel in the semiconductor layer; an insulating layer formed on another surface of the semiconductor layer; a plate electrode formed on the insulating layer; and a purge region formed in the semiconductor layer so as to purge minor carriers induced at an interface between the semiconductor layer and the insulating layer, the purge region being doped with a second conductivity impurity.

According to another aspect of the present invention, there is provided to a DRAM cell, comprising: a silicon-on-insulator (SOI) substrate where an insulating layer is sandwitched between a first silicon layer and a second silicon layer doped with impurities of a first conductivity type; a metal oxide silicon (MOS) transistor having a gate formed on the second silicon layer and a source and drain regions formed in the second silicon layer, the source and drain regions being doped with impurities of a second conductivity type to induce a channel in the second silicon layer under the gate; a plate junction region formed in the first silicon layer, the plate junction region being doped with impurities of the second conductivity type; and a purge region formed in the second silicon layer to purge minor carriers induced in an interface surface between the second silicon layer and the insulating layer, the purge region doped with impurities of the first conductivity type.

According to further another aspect of the present invention, there is provided to a DRAM, comprising: a silicon layer doped with impurities of a first conductivity type; a metal oxide semiconductor (MOS) transistor having a gate formed on one surface of the silicon layer and a source and drain regions formed in the silicon layer, the source and drain regions being doped with impurities of a second conductivity type to induce a channel in the silicon layer under the gate; an insulating layer formed on another surface of the silicon layer; a plate electrode formed on the insulating layer; a purge region formed in the silicon layer to purge minor carriers induced at a back surface of the silicon layer which is an interface surface between the silicon layer and the insulating layer, the purge region being doped with impurities of the first conductivity type; a word line connected to the gate of the MOS transistor, the word line for driving the MOS transistor; and a bit line connected to the drain region of the MOS transistor, the bit line for receiving and providing a binary data;

wherein the binary data is programmed in the DRAM according to whether the minor carriers are induced at the back surface or not and the binary data is read from the DRAM through the bit line by sensing the substrate current flowing through the MOS transistor.

According to still another aspect of the present invention, there is provided to a method for fabricating a DRAM cell, comprising the steps of: sequentially forming an oxide film and a doped polysilicon layer on a first silicon layer having a first conductivity type; patterning the polysilicon layer to form a plate electrode; forming an insulating layer on the first silicon layer including the plate electrode; bonding a second silicon substrate to the insulating layer; removing the first silicon layer by a selected thickness through a chemical mechanical polishing process to form a thin silicon layer; forming an isolation film in the silicon layer to define an active region; forming a gate on the active region of the silicon layer and a source and a drain regions in the silicon layer by doping impurities of a second conductivity type in the silicon layer so as to induce a channel in the silicon layer, thereby forming a metal oxide semiconductor transistor; and forming a purge region by doping impurities of the first conductivity type in the silicon layer.

According to still another aspect of the present invention, there is provided to a method for fabricating a DRAM cell, comprising the steps of: preparing a silicon-on insulator (SOI) substrate where an insulating layer is sandwiched between a first silicon layer having a first conductivity type and a second silicon layer; forming a plate region having a second conductivity type in the first silicon layer at an interface of the insulating layer and the first silicon layer; forming an isolation film in the silicon layer to define an active region; forming a gate on the active region of the silicon layer and a source and a drain regions in the silicon layer by doping impurities of the second conductivity type in the silicon layer so as to induce a channel in the silicon layer, thereby forming a metal oxide semiconductor transistor; and forming a purge region by doping impurities of the first conductivity type in the silicon layer.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

FIG. 1b is an equivalent circuit of the DRAM cell in FIG. 1a;

FIG. 7a through FIG. 7e are sectional views illustrating a process for fabricating the DRAM cell in accordance with an embodiment of the present invention;

DETAILED DESCRIPTION OF THE PRESENT INVENTION

Figure 2:
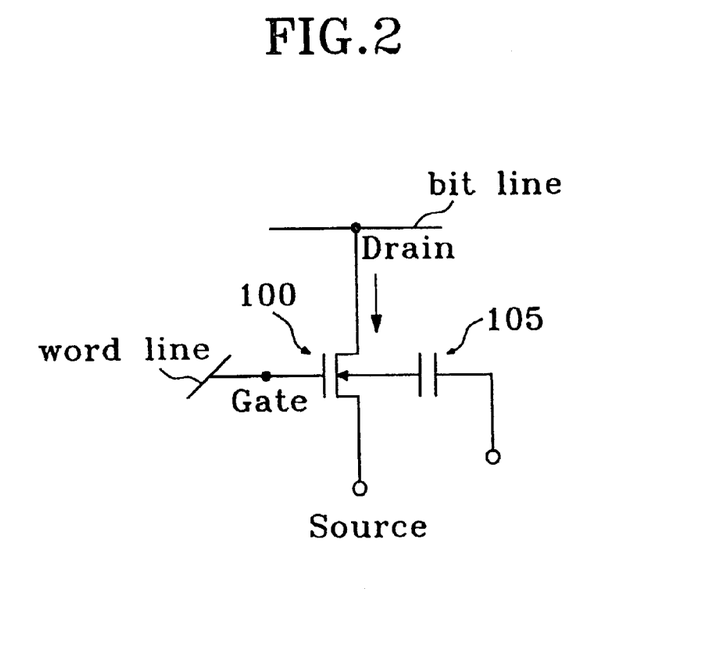
FIG. 2 is a conceptual circuit of a DRAM cell of the present invention.

FIG. 2 is a conceptual circuit of a DRAM cell of the present invention. The DRAM cell of FIG. 2, includes one MOS transistor 100 without a separate capacitor. A word line is connected to a gate of the MOS transistor 100, a fixed bias is applied to a source of the MOS transistor 100 and a bit line is connected to a drain of the MOS transistor 100. In the DRAM cell of the present invention having no separate capacitor, a parasitic capacitor 105 which is formed in a substrate for a MOS transistor 100 is used for a capacitor for storing the signal "1" or "0" which corresponds to the capacitor C of FIG. 1b.

In the embodiment, the DRAM cell includes the transistor 100 where the current driving characteristic is varied and the data "0" or "1" is detected from the current driving characteristic. A sense amplifier is driven not by charges transferred from a capacitor, but by drain current of the MOS transistor 100. The driving method of the sense amplifier in the DRAM cell of the present invention is different from that of the prior DRAM using an amount of charges stored in a capacitor so that the sensing speed of data is faster as compared with the prior DRAM cell.

Besides, in the DRAM cell of the embodiment, a capacitor, that is, the parasitic capacitor 105 plays a role only in varying the operation characteristic of the MOS transistor 200. Accordingly, the capacitor 105 may have a very small capacitance. Therefore, the DRAM cell of the preferred embodiment of the present invention can operate only by using a capacitor 105 parasitically made without a separate capacitor fabrication process. In the preferred embodiment, a silicon-on insulator(SOI) transistor, particularly a fully depleted SOI(FD SOI) transistor is used so as to embody the above DRAM cell.

Figure 3:
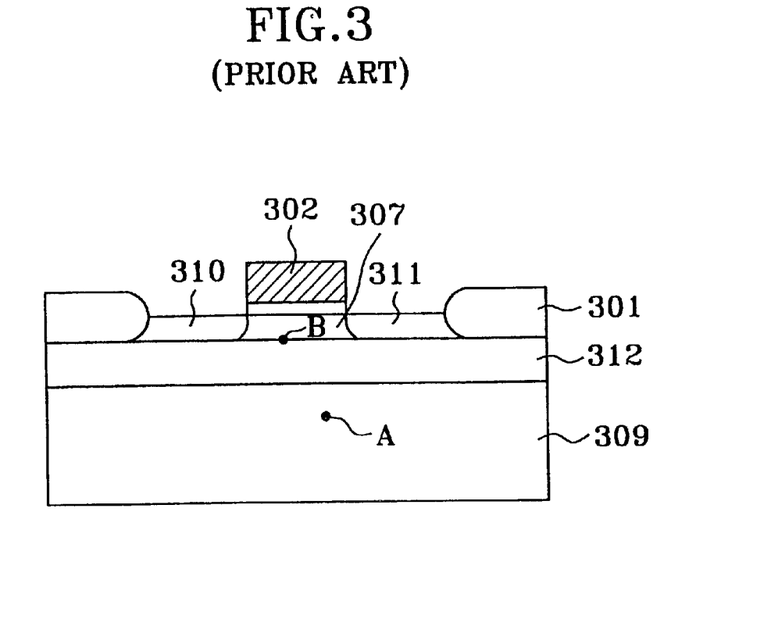
FIG. 3 is a sectional view of a conventional SOI transistor.

The characteristic of a SOI transistor in FIG. 3 showing a sectional view of a typical SOI transistor as follows. The SOI transistor has a structure that a MOS transistor is formed on a SOI substrate where a buried oxide 312 is sanwitched between a first silicon layer 309 for a supporting part and a second silicon layer 307 for device formation. An isolation film 301 is formed in the second silicon layer 307, a gate electrode is formed on the second silicon layer 307 and a source and drain regions 310 and 311 are formed in the second silicon layer 307 at both sides of the gate 302.

The SOI transistor has the characteristics as follows. First, adjacent SOI transistors formed on one SOI substrate are fully electrically isolated by the isolation film 301. With existence of the buried oxide 312 under the second silicon layer 307, the adjacent SOI transistors are electrically isolated by the buried oxide 312 and the isolation film 301. Second, The threshold voltage of the SOI transistor is varied with the voltage (back gate bias) applied to the first silicon layer 309. It is the typical characteristic that the threshold voltage of a conventional MOS transistor is varied with the voltage applied to a substrate. However, the threshold voltage variation of the SOI transistor is different from that of the conventional MOS transistor. The threshold voltage of the SOI transistor is varied with a thickness of the buried oxide 312. For example, if a thickness of the buried oxide 312 is 200 Å and a thickness of a gate oxide is 50 Å, the threshold voltage of the SOI transistor is varied with a tolerance of about 1V at a back gate bias of 4V.

Figure 4:
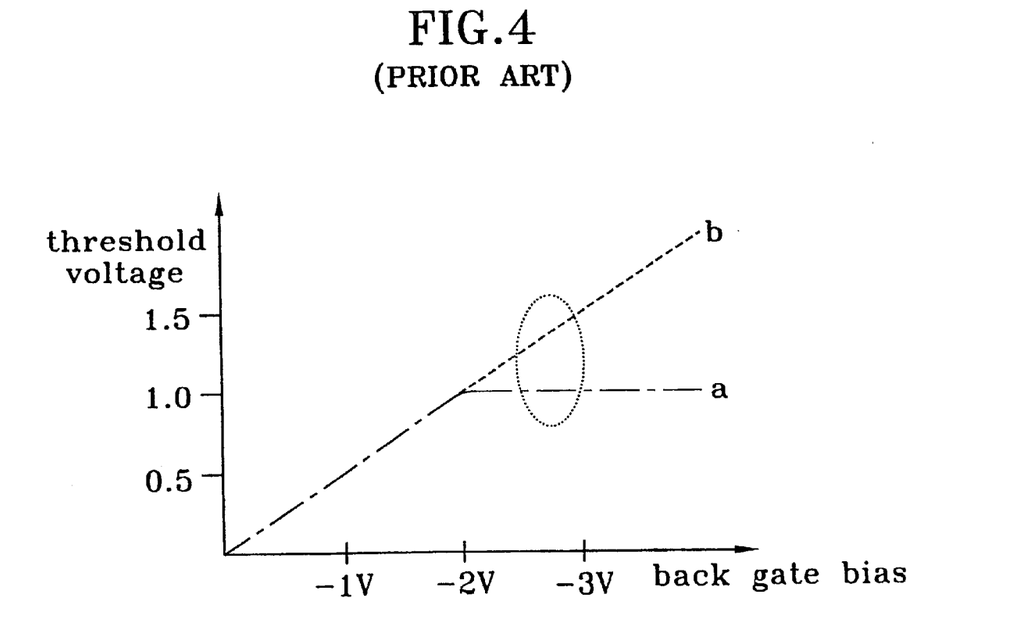
FIG. 4 is a graph illustrating the relationship between a back gate bias and a threshold voltage of a conventional FD SOI transistor.

FIG. 4 is a graph illustrating a variation of the SOI transistor to a back gate bias applied to the first silicon layer 309. The threshold voltage is varied with the state of the interface surface between the second silicon layer 307 and the buried oxide 312 (Hereinafter, referred to as a back surface) as "B" shown in FIG. 3. For example, if the holes are accumulated in the back surface, the variation of the back gate bias applied to the first silicon layer 309 is screen by the holes accumulated in the back surface B. The threshold voltage of the MOS transistor to the back gate bias does not varied as the curve "a" shown in FIG. 4, if the back gate bias of below −2v is applied to the first silicon layer 309. While the holes are not sufficiently accumulated in the back surface B, the electric field generated by the back gate bias continuously affects a channel region so that the threshold voltage is varied in proportion to the back gate bias as the curve "b" shown in FIG. 4. Referring to FIG. 4, if the back gate bias is −3V, the MOS transistor which is fabricated so as to have the threshold voltage of 1V, in case the holes accumulated in the back surface and otherwise so as to have the threshold voltage of 1.5V, is used in the DRAM cell of the present invention. Herein, an amount of the holes accumulated in the back surface is controllable to the doping quantity of the second silicon layer 307 and the thicknesses of the buried oxide 312 and the gate oxide and the like.

Figure 5:
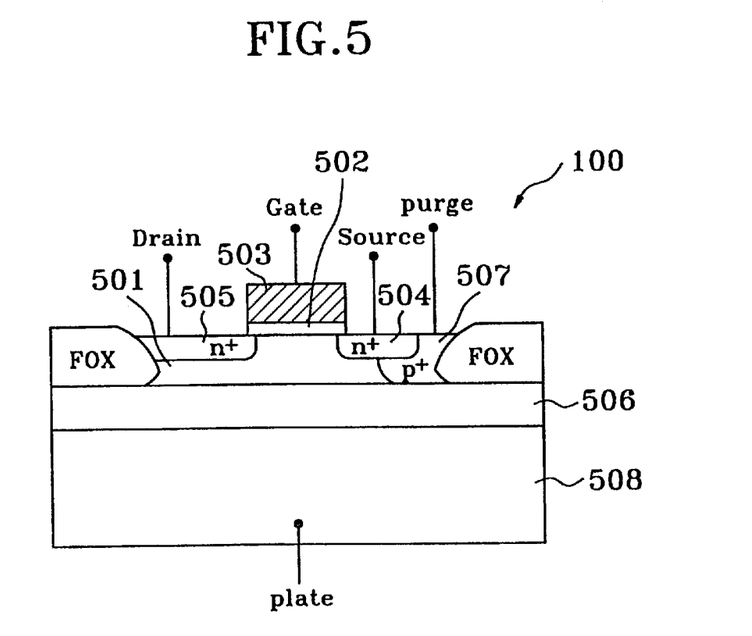
FIG. 5 is a sectional view of a DRAM cell in accordance with the present invention.

FIG. 5 is a sectional view of a DRAM cell of in accordance with an embodiment of the present invention. In the preferred embodiment, the DRAM cell having a N-channel MOS transistor is disclosed. It is obvious that the present invention is applicable to the DRAM cell having a p-channel MOS transistor with ease by the person skilled in the art. The DRAM cell includes a SOI transistor 100 having a gate insulator 502 and a gate 503 formed on one surface of the p type silicon layer 501 and a source and drain regions 504 and 505 formed in the silicon layer 501 and doped with the $N^+$ type impurities so as to induce a channel region of the silicon layer 501 under the gate 503.

The DRAM cell includes an insulating layer 506 formed on another surface of the silicon layer 501 and a conduction layer for a plate electrode 508. The DRAM cell further includes a purge region 507 formed in the silicon layer 501 under the source region 504 so as to surround in part the source region 504 and doped with the $p^+$ type impurity, the purge region 507 being to purge minor carriers at the back surface which is an interface surface between the silicon layer 501 and the insulating layer 506. The source and drain regions 504 and 505 are formed to a depth vertically spaced in a predetermined distance from the interface surface between the insulating layer 506 and the silicon layer 501 which is the back surface. The purge region 507 is formed to surround the portion of source region 504 and to be contacted with the insulating layer 506. The word line for selecting corresponding ones of the DRAM cells is connected to the gate 503 and the bit line is connected to the drain region 505. The constant voltage, for example 1V, is always applied to the source region 504. The negative voltage, for example −3V, is always applied to the conduction layer 508 for a plate electrode. The source and a drain regions 504 and 505 should be not contacted with the insulating layer 506 in order for the purge region 507 to affect the silicon layer 501 under the gate 503 which is a channel region. For example, if the thickness of the silicon layer 501 is 0.15 μm, the source and drain regions may preferably have the junction depth of 0.1 μm.

The operation of the DRAM cell having the above structure will be described with reference to the following table 1. The table 1 is an example of the operation voltage according to the operation condition.

TABLE 1

|  | write "0" | write "1" | read "0" | read "1" |
|---|---|---|---|---|
| Vpurge |  | 0 V |  | 1 V |
| Vbit | 1 V | 5 V | defect | defect |
| Vword |  | 3 V |  | 2.5 V |
| Vss |  |  | 1 V |  |
| Vp |  |  | −3 V |  |

Herein, the operation condition is only the typical example and the voltage may be varied according to the fabrication method and the operation characteristics of the transistor.

Firstly, the method for programming the data in the DRAM cell. If 0V or −1V is applied to the purge region 507, holes which exist at the interface surface between the silicon layer 501 and the insulating layer 506 (the back surface) are fully removed. The data "1" is programmed in DRAM cells connected to a selected word line. Next, the voltage of 1V is supplied to the bit line so as to program the data "0" and the voltage of 5V is supplied to the bit line so as to program the data "1". While the voltage of 3V is supplied to the word line, the transistor 101 turns on. But, the same voltage of 1V is supplied to the bit line and the source region 505 so that the data "0" is left as it is. In case the data "1" is programmed in the DRAM cell, the voltage of 5V is supplied to the bit line and the word line is activated to flow the current through the transistor 101. At this time, the voltage of −3V is supplied to the plate electrode 508 and the purge operation is initially carried out by the purge region 507. Therefore, since the voltage of 1V is applied to the source 504, 5V the drain 505 and 3V the gate 502 and the threshold voltage is 1.5V, the voltage difference between the source 504 and the gate 503 becomes 2V and the voltage difference between the source 504 and the drain 505 is 4V so that large substrate current flows in the n-channel MOS transistor.

The substrate current in the n-channel MOS transistor is the current flowing by holes which are the minor carrier. The holes are accumulated at an interface between the insulating layer 506 and the silicon layer 501 which is the back surface by the negative voltage applied to the plate electrode 508. The accumulated holes screen the electric field generated by the voltage of the plate electrode 508 and the threshold voltage of the MOS transistor becomes lowered to 1V, thereby programming the data "1". The time required in program is 3 ns(nano second) in case the substrate current is 100 nA and the capacitance of the parasitic capacitor due to the insulation layer 506 per a cell is 0.1 fF. While the time required in program is 30 ns in case the substrate current is 100 nA and the capacitance of the parasitic capacitor due to the insulation layer 506 per a cell is 1.0 fF.

Next, the method for reading the data programmed in the DRAM cell. If the holes are accumulated at the back surface by the above-mentioned program, that is, if the data "1" is programmed, the threshold voltage of the transistor is 1V. While the holes are not accumulated at the back surface, that is, if the data "0" is programmed, the threshold voltage of the transistor is 1.5V. If the voltage of 1V is applied to the source region 505, the voltage of 2.5V is applied to the gate 503 and the voltage of 1V which is equal to the voltage applied to the source region 505, is applied to the purge region 507, the voltage difference of 1.5V between the source region 505 and the gate 503 is produced. Therefore, in case the data "1" is programmed in the DRAM cell, the channel is induced in the silicon layer 501 between the source and drain regions 504 and 505 and then the current flows to the drain region

505. On the contrary, in case the data "0" is programmed in the DRAM cell, the current does not flow to the drain region 505. Accordingly, there is a wide difference in the current flowing to the drain region 505 from several times to tens times according to whether the minor carriers are accumulated at the back surface or not. Therefore, the binary date of "0" or "1" is read from the current flowing through the drain region 505.

Figure 6:
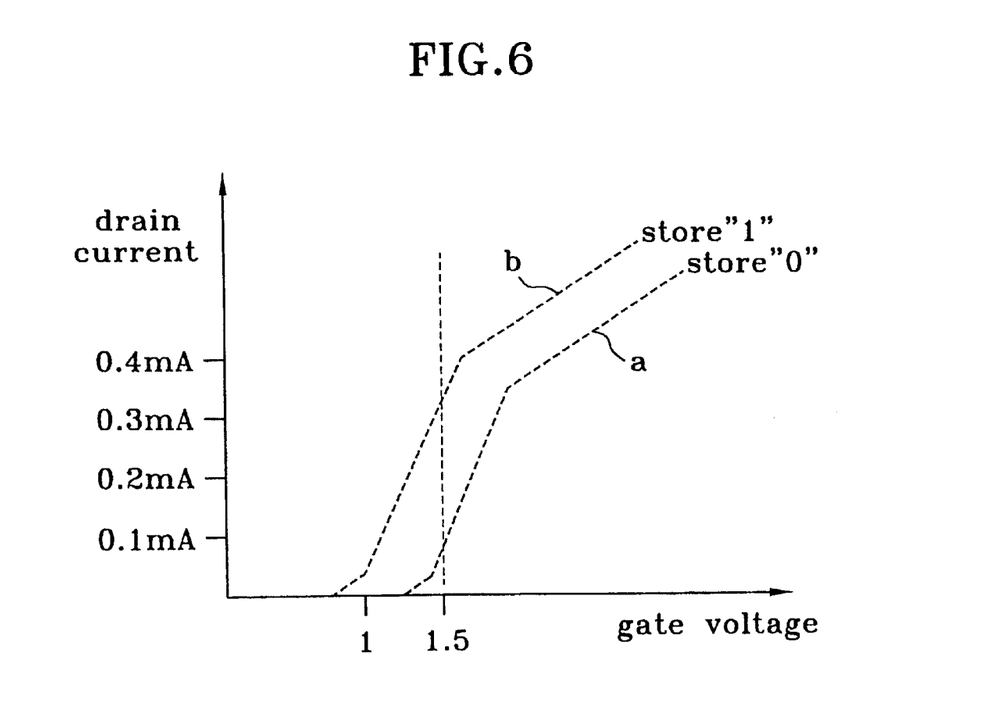
FIG. 6 is a graph illustrating the relationship between a gate voltage and a drain current of the DRAM cell of the present invention.

FIG. 6 is a graph showing the experimentation result. The curve "a" shows the characteristic of the drain current-gate voltage in case the voltage of 0V is applied to the purge region 507. It is noted that the threshold voltage is raised to 1.5V from the curve "a". Although repeatedly read the data from the DRAM cell, the characteristic of the drain current-gate voltage of the MOS transistor does not changed. The curve "b" shows the characteristic of the drain-gate voltage in case the data is programmed in the DRAM cell by turning the transistor on by applying the voltage of 5V to the drain region 505. It is noted that the drain current of 0.3 mA flow through the drain region 505 from the curve b in case of the gate voltage of 1.5V. Although repeatedly read the data from the DRAM cell, the characteristic of, the drain current-gate voltage of the MOS transistor follows the curve "b". while the voltage of 0V is applied to the purge region 507, the characteristic of the transistor becomes as the curve "a".

On the other hand, as a result of measurement of loss time of the data due to the holes supplied by the leakage current, it takes 5 minutes in the DRAM cell of the present invention in case the capacitance of the insulating layer 506 sandwitched between the silicon layer 501 and the plate electrode 508 is about 1 fF. As compared with the refresh time of typically several ten seconds in the conventional DRAM, this means that the DRAM cell of the present invention can store the data without loss for a long time. It means that the present invention extends the refresh time of the DRAM cell and it has an excellent characteristic.

Figure 7A:
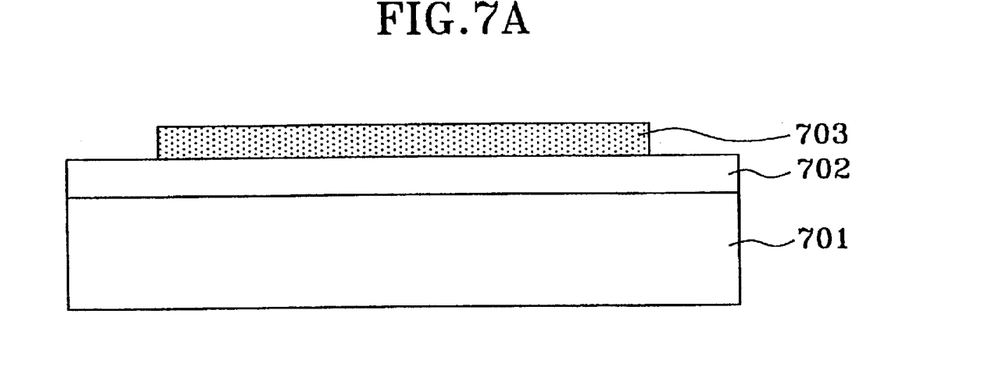
Figure 7B:
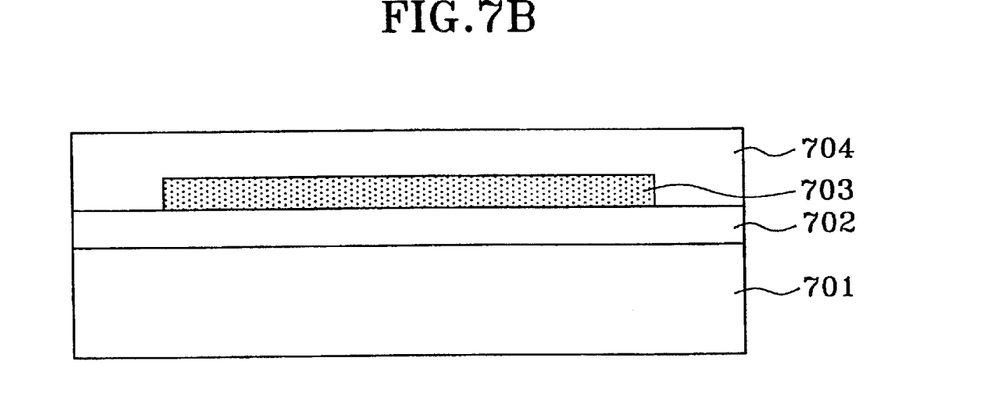
Figure 7C:
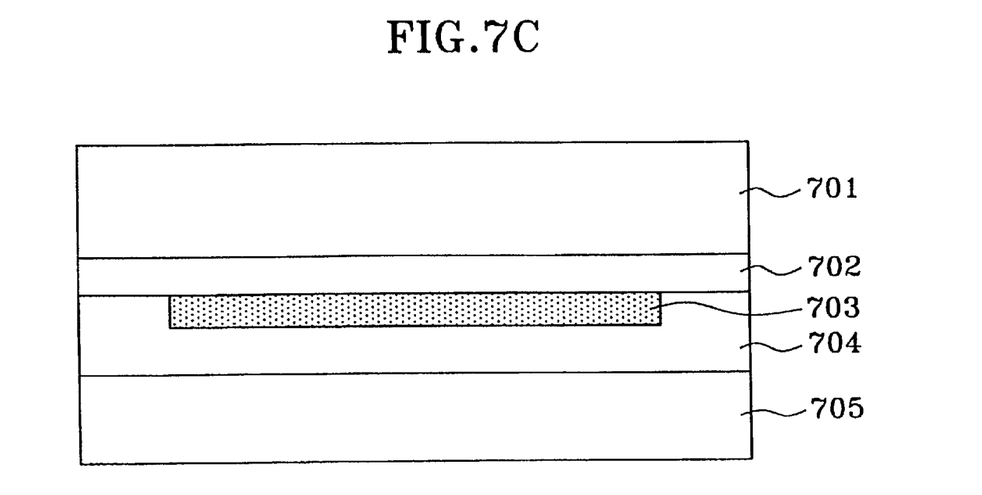
Figure 7D:
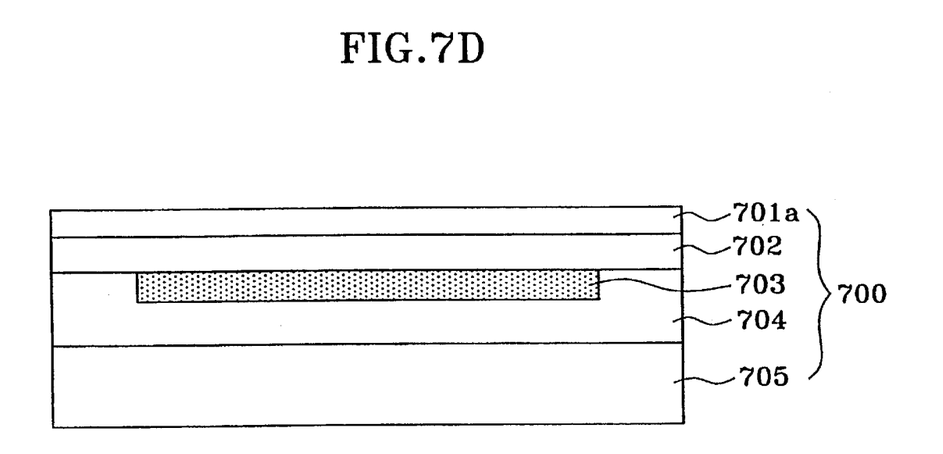
Figure 7E:
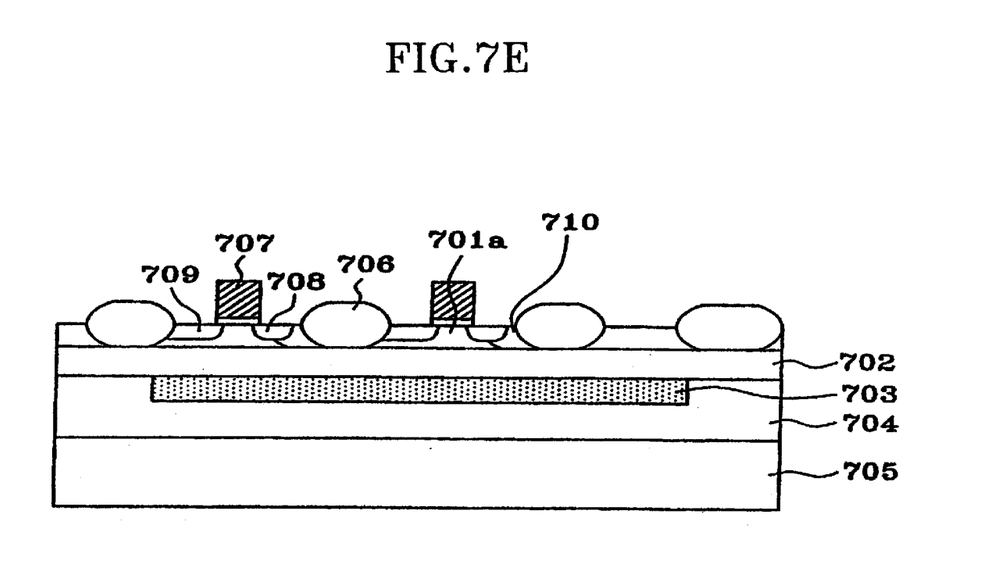

FIG. 7a through FIG. 7e a sectional view illustrating a process for fabricating a DRAM cell in accordance with an embodiment of the present invention. An oxide film 702 and an doped polysilicon layer 703 are sequentially formed on a p type first silicon substrate 701 and the N⁺-type impurity-doped polysilicon layer 703 is then patterned in the plate electrode form (FIG. 7a). An insulating layer 704 is formed over the oxide film 702 including the patterned polysilicon layer 703 and planarized through the chemical mechanical polishing (CMP) process (FIG. 7b). A second silicon substrate 705 is bonded to the planarized insulating layer 704 formed over the first silicon layer 701 (FIG. 7c). The first silicon layer 701 is removed by the CMP process by a predetermined thickness to form a silicon layer 701a having a thickness of 0.1–0.5 μm, thereby providing a SOI substrate 700 (FIG. 7d). An isolation film 706 is formed in the silicon layer 701a through the LOCOS process to define an active region of the silicon layer 701a. In the active region of the silicon layer 701a, a MOS transistor having a gate 707 and a N⁺-type source and drain regions 708 and 709 is formed and a P⁺ purge region 710 is formed through the ion implantation process (FIG. 7e).

Figure 8:
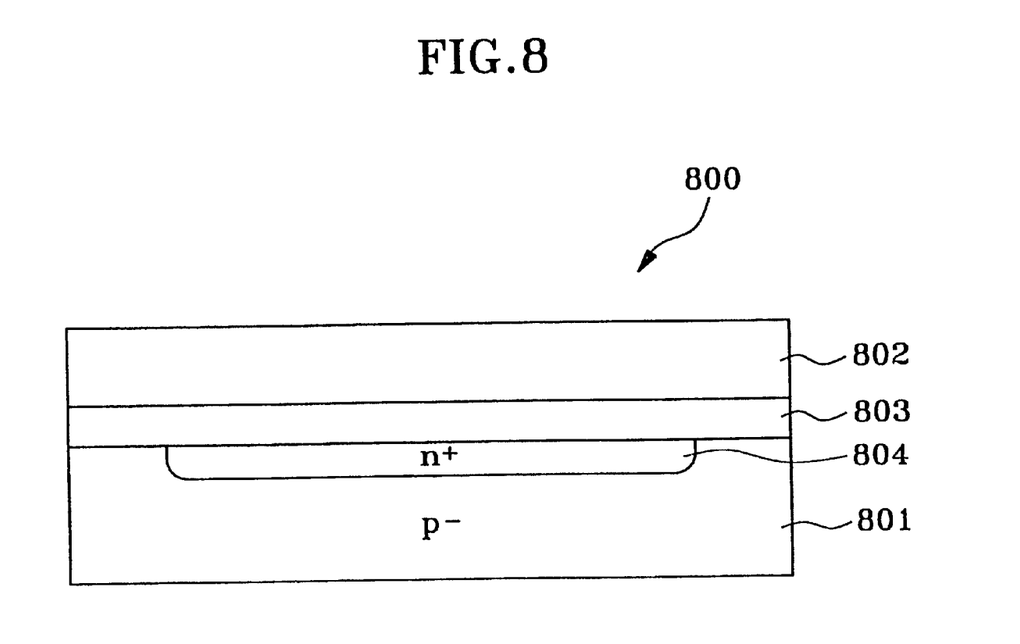
FIG. 8 is a sectional view illustrating a process for fabricating a DRAM cell in accordance with another embodiment of the present invention.

The process for fabricating The DRAM cell of the preferred embodiment is very simple as compared with the process for fabricating the stack capacitor. In the preferred embodiment, although the SOI substrate is fabricated using the CMP process, it may use the SOI substrate of a finished product which has been commercially sold. FIG. 8 shows a sectional view of a SOI substrate which has been commercially sold. The SOI substrate 800 has a structure that an insulating layer 803 is sandwitched between a first silicon layer 801 and a p-type second silicon layer 802. A N⁺ plate region 804 is formed in the first silicon layer 801 through the implantation process and the heat treatment. In the ion implantation, the ion implantation energy of the impurities should be controlled so as to inject the impurities into the portion of the first silicon layer 801 which is to form the N⁺ plate region 804. The following process is the same as in FIG. 7e.

According to the DRAM cell of the present invention, the MOS transistor directly drives the DRAM cell so that the driving speed is very fast as compared with the prior DRAM cell. Of the charges accumulated in the buried oxide of the SOI substrate, an amount of charges which are removed by the leakage current is few so that the charge quantity does not vary for several seconds. Besides, the conventional DRAM should continually carry out the refresh to prevent the data stored in the DRAM cell from disappearing after 0.1 seconds, while the DRAM cell of the present invention can extend refresh period to one second or several seconds. Furthermore, the fabrication method of the DRAM cell of the present invention is very simple, thereby cutting down the fabrication cost and removing the problems caused in fabricating the stack capacitors.

The foregoing description shows only a preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A method for fabricating a dynamic random access memory (DRAM) cell, comprising the steps of:
   sequentially forming an oxide film and a doped polysilicon layer on a first silicon substrate having a first conductivity type;
   patterning the polysilicon layer to form a plate electrode;
   forming an insulating layer on the first silicon substrate including the plate electrode;
   bonding a second silicon substrate to the insulating layer;
   removing the first silicon substrate by a selected thickness through a chemical mechanical polishing process to form a thin silicon layer;
   forming an isolation film in the silicon layer to define an active region;
   forming a gate on the active region of the silicon layer and a source and a drain regions in the silicon layer by doping impurities of a second conductivity type in the silicon layer so as to induce a channel in the silicon layer, thereby forming a metal oxide semiconductor transistor, wherein the source and the drain regions are formed in the silicon layer to be spaced in a selected distance from an interface surface between the oxide film and the silicon layer; and
   forming a purge region by doping impurities of the first conductivity type in the silicon layer.

2. The method as claimed in claim 1, wherein the purge region is formed in the silicon layer to be contacted with the oxide film and to surround in part the source region.

3. A method for fabricating a dynamic random access memory (DRAM) cell, comprising the steps of:
   preparing a silicon-on insulator (SOI) substrate where as insulting later is sandwitched between a first silicon layer and a second silicon layer having a first conductivity type;
   forming a plate electrode having a second conductivity type in the insulating layer;

forming an isolation film in the second silicon layer to define an active region;

forming a gate on the active region of the second silicon layer and a source and a drain regions in the second silicon later by doping impurities of a second conductivity type in the second silicon layer so as to induce a channel in the second silicon layer, thereby forming a metal oxide semiconductor transistor, wherein the source and the drain regions are formed in the second silicon layer to be spaced in a selected distance from an interface surface between the insulating layer and the second silicon layer; and forming a purge region by doping impurities of the first conductivity type in the second silicon layer.

4. The method as claimed in claim 3, wherein the purge region is formed in the second silicon layer to be contacted with the insulating layer and to surround in part the source region.

* * * * *